US012800672B2

(12) United States Patent
Jeong

(10) Patent No.: US 12,800,672 B2
(45) Date of Patent: Nov. 17, 2026

(54) DEFECT TYPE CLASSIFYING SYSTEM AND DEFECT TYPE CLASSIFYING METHOD

(71) Applicant: LG Energy Solution, Ltd., Seoul (KR)

(72) Inventor: Jaeyoon Jeong, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 399 days.

(21) Appl. No.: 18/280,750

(22) PCT Filed: Aug. 9, 2022

(86) PCT No.: PCT/KR2022/011827
§ 371 (c)(1),
(2) Date: Sep. 7, 2023

(87) PCT Pub. No.: WO2023/018165
PCT Pub. Date: Feb. 16, 2023

(65) Prior Publication Data
US 2024/0142535 A1 May 2, 2024

(30) Foreign Application Priority Data
Aug. 10, 2021 (KR) ........................ 10-2021-0105497

(51) Int. Cl.
*G01R 31/392* (2019.01)
*G01R 19/04* (2006.01)
(Continued)

(52) U.S. Cl.
CPC ........... *G01R 31/392* (2019.01); *G01R 19/04* (2013.01); *G01R 19/16542* (2013.01);
(Continued)

(58) Field of Classification Search
CPC G01R 31/3835; G01R 31/364; G01R 31/392; G01R 19/04; G01R 19/2509;
(Continued)

(56) References Cited

U.S. PATENT DOCUMENTS 11,016,149 B2 * 5/2021 Quiambao ........... G01R 31/392
12,203,996 B2 * 1/2025 Kim ..................... G01R 31/396
(Continued)

FOREIGN PATENT DOCUMENTS

CN 101351717 A 1/2009
CN 107176038 A 9/2017
(Continued)

OTHER PUBLICATIONS

Naha Arunava et al: "Internal short circuit detection in Li-ion batteries using supervised machine learning", Scientific Reports, vol. 10, No. 1, Jan. 28, 2020 (Jan. 28, 2020), XP055871128, DOI: 10.1038/s41598-020-58021-7. 10 pgs.
(Continued)

*Primary Examiner* — An H Do
(74) *Attorney, Agent, or Firm* — Lerner David LLP

(57) ABSTRACT

A defect type classifying system includes: a measurer connected to a battery from which a defect type is detected, and measuring at least one of electrical characteristics of the battery for a predetermined test period and generating measured data; a converter for generating input data by converting the measured data; and a defect type predicting module for machine-learning learning data, and determining a defect type of the battery based on the input data. The input data may be appropriate for an input node of the defect type predicting module, and the defect type may be classified according to a cause of a short-circuit defect of the battery.

8 Claims, 2 Drawing Sheets

(51) Int. Cl.

| | |
|---|---|
| ***G01R 19/165*** | (2006.01) |
| ***G01R 19/25*** | (2006.01) |
| ***G01R 19/257*** | (2006.01) |
| ***G01R 31/364*** | (2019.01) |
| ***G01R 31/367*** | (2019.01) |
| ***G01R 31/3835*** | (2019.01) |

(52) U.S. Cl.
CPC ....... *G01R 19/2509* (2013.01); *G01R 19/257* (2013.01); *G01R 31/364* (2019.01); *G01R 31/367* (2019.01); *G01R 31/3835* (2019.01)

(58) Field of Classification Search
CPC ......................... G01R 19/257; G01R 31/3865; G01R 31/367; G01R 19/16542; G01R 19/003; G01R 31/52; H01M 10/42; H01M 10/48; H01M 2010/4271
See application file for complete search history.

(56) References Cited

U.S. PATENT DOCUMENTS

| | | | |
|---|---|---|---|
| 2007/0096689 | A1 | 5/2007 | Wozniak |
| 2015/0377948 | A1 | 12/2015 | Zhang et al. |
| 2016/0018472 | A1 | 1/2016 | Sung et al. |
| 2016/0195587 | A1 | 7/2016 | Lee |
| 2017/0259687 | A1 | 9/2017 | Chikkannanavar et al. |
| 2019/0072614 | A1 | 3/2019 | Steingart et al. |
| 2020/0278400 | A1 | 9/2020 | Zhang et al. |
| 2020/0358396 | A1 | 11/2020 | Rao et al. |
| 2021/0088591 | A1 | 3/2021 | Naha et al. |
| 2021/0132151 | A1 | 5/2021 | Lee et al. |
| 2021/0167428 | A1 | 6/2021 | Zhang et al. |

FOREIGN PATENT DOCUMENTS

| | | | |
|---|---|---|---|
| CN | 108344947 | A | 7/2018 |
| CN | 109004903 | A | 12/2018 |
| CN | 110927606 | A | 3/2020 |
| CN | 111025153 | A | 4/2020 |
| CN | 111444615 | A | 7/2020 |
| CN | 112327189 | A | 2/2021 |
| CN | 112557955 | A | 3/2021 |
| CN | 112782589 | A | 5/2021 |
| JP | 2014167450 | A | 9/2014 |
| JP | 2015197408 | A | 11/2015 |
| JP | 2020537114 | A | 12/2020 |
| JP | 2021012889 | A | 2/2021 |
| KR | 20160010132 | A | 1/2016 |
| KR | 20160085070 | A | 7/2016 |
| KR | 20200023672 | A | 3/2020 |
| KR | 20200061704 | A | 6/2020 |
| KR | 102206908 | B1 | 1/2021 |
| KR | 102259643 | B1 | 6/2021 |

OTHER PUBLICATIONS

Extended European Search Report including Written Opinion for Application No. 22856162.7 dated Jun. 25, 2024. pgs.

Search Report dated Sep. 16, 2025 from the Office Action for Chinese Application No. 202280007938.9. issued Sep. 19, 2025. 3 pgs.

Youyun, Y, "Python", Machinery Industry Press, Mar. 31, 2021. 6 pgs.

International Search Report for Application No. PCT/KR2022/011827 mailed Nov. 30, 2022. 3 pages.

Search Report dated Jan. 15, 2026 from the Office Action for Chinese Application No. 202280007938.9 issued Jan. 16, 2026, 2 pages.

Li, D. et al. "Battery Fault Diagnosis for Electric Vehicles Based on Voltage Abnormality by Combining the Long Short-Term Memory Neural Network and the Equivalent Circuit Model." IEEE Transactions on Power Electronics, Jul. 2020, 1-13 pages, vol. 36, Issue 2.

* cited by examiner

【Figure 1】
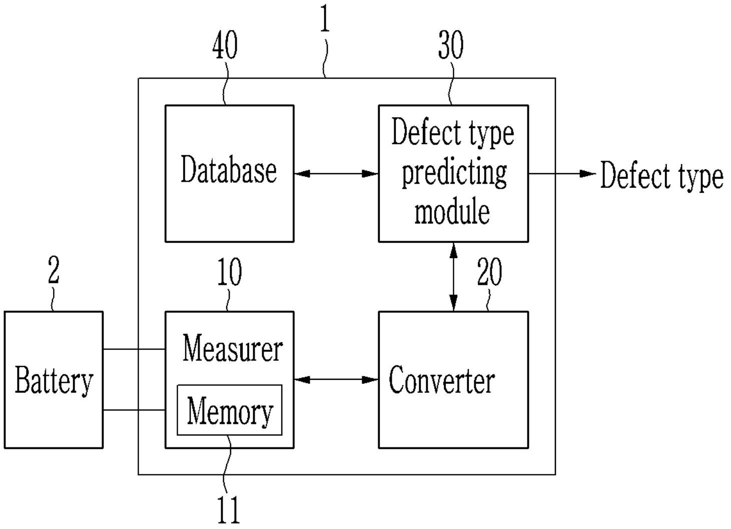
【Figure 2】
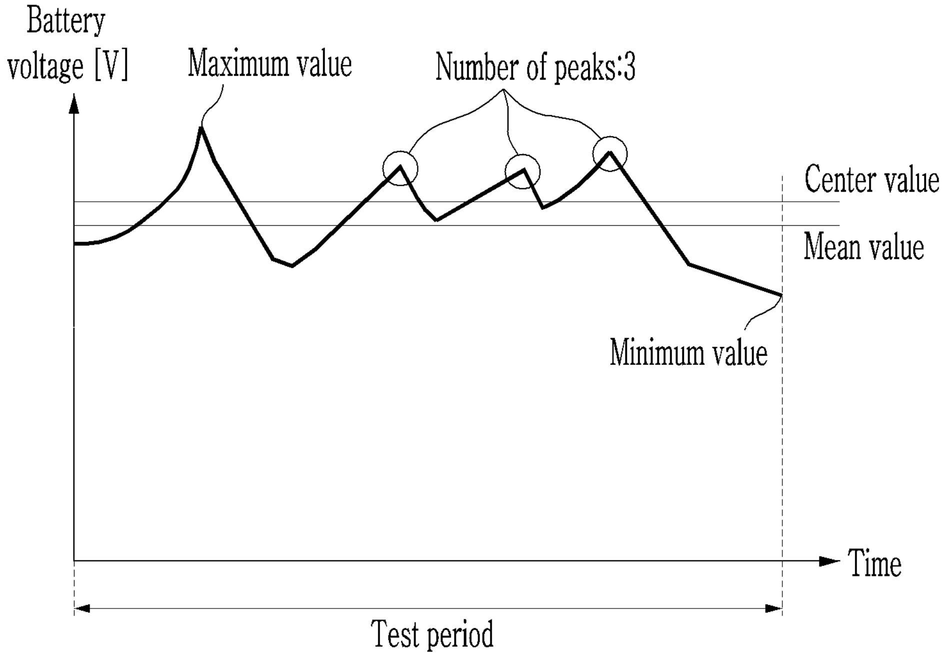

【Figure 3】
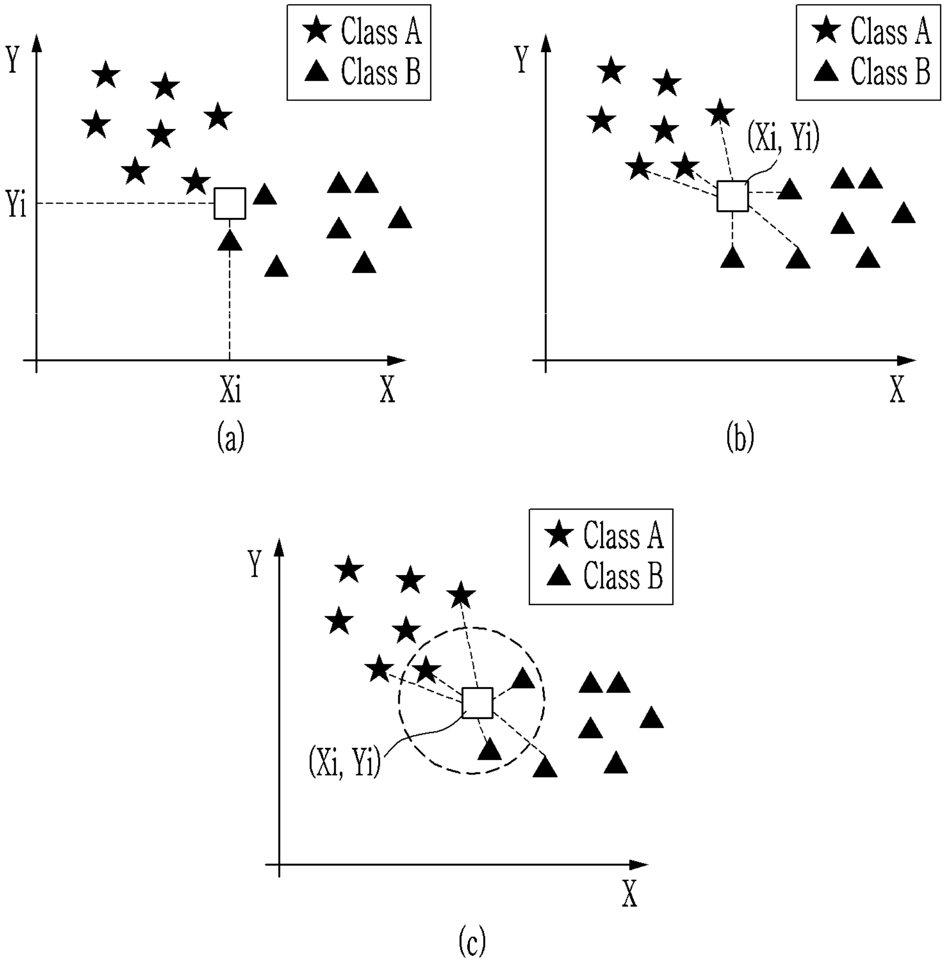

DEFECT TYPE CLASSIFYING SYSTEM AND DEFECT TYPE CLASSIFYING METHOD

CROSS-REFERENCE TO RELATED APPLICATION

This application is a national stage entry under 35 U.S.C. § 371 of International Application No. PCT/KR2022/011827, filed on Aug. 9, 2022, which claims priority to Korean Patent Application No. 10-2021-0105497, filed on Aug. 10, 2021, the entire contents of which are hereby incorporated herein by reference in their entireties.

TECHNICAL FIELD

The present disclosure relates to a defect type classifying system and a defect type classifying method.

Background Art

During processes for manufacturing batteries, a check for defects may be performed for each production process. For example, factors used for checking whether defects are generated for the respective manufacturing processes are specified, and it may be detected whether the defects are generated to the batteries by using a gauge for measuring the corresponding factors. When the defects of the battery are detected according to the existing method using a gauge, the defect generated state in the measuring section for which the measure is performed, and measured values including battery voltages and currents at the measuring time, may only be known. Causes of generation of the detected battery defects may be unknown. To find the defect generated causes, a worker has to directly disassemble and analyze the faulty battery.

DISCLOSURE

The present invention has been made in an effort to provide a system and method for classifying a defect type of a battery.

An embodiment of the present invention provides a defect type classifying system including: a measurer connected to a battery from which a defect type is detected, and measuring at least one of electrical characteristics of the battery for a predetermined test period and generating measured data; a converter for generating input data by converting the measured data; and a defect type predicting module for machine-learning learning data, and determining a defect type of the battery based on the input data. The input data may be appropriate for an input node of the defect type predicting module, and the defect type may be classified according to a cause of a short-circuit defect of the battery.

The measurer may measure a battery voltage that is a voltage at respective ends of the battery for the test period and may store the measured data indicating the measured result.

The converter may analyze the measured data and extract at least one of a maximum value, a minimum value, a mean value, and a center value of the battery voltage and the number of peaks of the battery voltage to generate the input data.

The measured data may be based on a result obtained by measuring a battery voltage that is a voltage at respective ends of the battery for a predetermined test period, and the input data may include at least one of a maximum value, a minimum value, a mean value, and a center value of the battery voltage, and the number of peaks of the battery voltage.

The defect type classifying system may further include a database for storing the learning data, wherein the database may store input data based on a voltage at respective ends of the battery and a defect type when a short-circuit defect of the battery is generated.

The defect type predicting module may calculate deviations that are distance differences between at least one of electrical characteristics measured for a target battery of which a defect type is classified and respective values belonging to the learning data, may deduce a predetermined number of reference data in least order of the calculated deviations, and may classify the defect type of the target battery with the class that has the greatest result of counting the classes to which the deduced reference data respectively belong.

The defect type predicting module may receive at least one of electrical characteristics from the learning data, and may learn to predict a defect type that corresponds to the received one of the electrical characteristics to be one of a plurality of classes.

Another embodiment of the present invention provides a defect type classifying method, including: allowing a defect type predicting module to learn to classify a defect type according to a cause of a short-circuit defect of a battery based on learning data; allowing a measurer to measure at least one of electrical characteristics of the battery for a predetermined test period and generate measured data; allowing a converter to convert the measured data and generate input data; and allowing the defect type predicting module to determine a defect type of the battery based on the input data, wherein the input data may be appropriate for an input node of the defect type predicting module.

The generating of measured data may include measuring a battery voltage that is a voltage at respective ends of the battery for the test period, and generating the measured data indicating the measured result.

The generating of input data may include analyzing the measured data, extracting at least one of a maximum value, a minimum value, a mean value, and a center value of the battery voltage, and the number of peaks of the battery voltage, and generating the input data.

The measured data may be based on a result obtained by measuring a battery voltage that is a voltage at respective ends of the battery for a predetermined test period, and the input data may include at least one of a maximum value, a minimum value, a mean value, and a center value of the battery voltage, and the number of peaks of the battery voltage.

The defect type classifying method may further include allowing a database to store the input data based on the voltage at respective ends of the battery when a short-circuit defect of the battery is generated, and the defect type, as the learning data.

The determining of a defect type may include: calculating deviations that are distance differences between at least one of electrical characteristics measured for the target battery from which the defect type is classified and respective values belonging to the learning data; and deducing a predetermined number of reference data in least order from among the calculated deviations, and classifying the defect type of the target battery with the class that has the greatest result of counting the classes to which the deduced reference data respectively belong.

The learning to classify the defect type may include receiving at least one of electrical characteristics from the learning data, and learning to predict the defect type that corresponds to one of the received electrical characteristics to be one of a plurality of classes.

The present disclosure provides a defect type classifying system and method for detecting the defect causes of the batteries generated for the manufacturing process.

There have been deviations of accuracy of analyzing skill levels and defects on disassembling the battery among workers detecting causes of defects and deducing the causes. The present disclosure may increase the accuracy of defect-type analysis, and may increase accuracy on a predetermined degree without deviation of the accuracy. In addition, when the defect type is analyzed, the time for the worker to analyze the defect type may be substantially reduced.

DESCRIPTION OF THE DRAWINGS

FIG. 1 shows a block diagram of a defect type classifying system according to an embodiment.

FIG. 2 shows a graph of a method for generating input data from measured data generated by measuring battery voltages according to an embodiment.

FIG. 3 shows an operation of a defect type predicting module according to an embodiment.

MODE FOR INVENTION

The present disclosure includes two stages so as to efficiently learn a feature value of a faulty battery. A first machine learning stage includes allowing a defect type predicting module to machine-learn a feature value of a faulty battery, and a second classifying stage includes allowing the machine-learning defect type predicting module to determine a defect cause of the faulty battery. Regarding the first machine learning stage, the defect type predicting module learns electrical feature values such as the measured voltages or currents of the faulty battery and the defect causes of the corresponding faulty battery. Regarding the second classifying stage, the electrical feature values of the defect-generated battery are measured, the measured feature values are input to the defect type predicting module, and the defect type predicting module may determine the defect cause based on the input feature values.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier, and hence, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without the other component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 shows a block diagram pf a defect type classifying system according to an embodiment.

As shown in FIG. 1, the defect type classifying system 1 includes a measurer 10, a converter 20, a defect type predicting module 30, and a database 40.

The measurer 10 may be connected to a battery 2 for detecting a defect type, may measure at least one of the electrical characteristics of the battery 2 for a predetermined test period, and may generate measured data based on a measured result, and may store the measured data. The measurer 10 may include a memory 11 for storing the measured data. The memory 11 may be a non-volatile memory for storing the measured data. When the battery for detecting a defect type is replaced, the measurer 10 may erase content stored in the memory 11 and may write new measured data.

For example, the measurer 10 may measure a battery voltage that is a voltage between a positive electrode and a negative electrode of the battery 2 for a test period, and may store measured data for indicating the battery voltage measured for the test period in the memory 11. The present disclosure is not limited to use the battery voltage so as to detect the defect type. One or more of the battery voltage, the battery current flowing to the battery, internal resistance of the battery, inductance of the battery, and capacitance of the battery may be used to detect the defect type of the battery.

The converter 20 converts the measured data and generates input data that are appropriate for the defect type predicting module 30. The input data are determined according to a value to be input to an input node of the defect type predicting module 30. The converter 20 reads the measured data from the memory 11, analyzes the read measured data, extracts characteristics of the analyzed measured data, and generates input data.

FIG. 2 shows a graph of a method for generating input data from measured data generated by measuring battery voltages according to an embodiment.

FIG. 2 shows an example for describing one of the various methods for generating input data, which does not limit the present disclosure.

As shown in FIG. 2, for the test period, the measurer 10 measures a voltage at respective ends of the battery 2, generates measured data on the battery voltage, and stores the generated measured data in the memory 11.

The converter 20 reads the measured data from the memory 11, analyzes the read measured data, extracts a maximum value, a minimum value, a mean value, and a center value that are characteristics of the measured data, and the number of peaks from the measured data, and generates input data. That is, the input data include the maximum value, the minimum value, the mean value, the center value of the battery voltage, and the number of the peaks of the battery voltage for the test period.

The defect type predicting module 30 machine-learns learning data stored in the database 40. The database 40 classifies the input data for respective defect types and stores the same, and the corresponding input data and the defect type may be updated in the database 40 each time the defect is generated in the battery. Here, the input data may include at least one of the maximum value, the minimum value, the mean value, the center value of the battery voltage, and the number of the peaks of the battery voltage.

The defect type predicting module 30 may input the input data stored for respective defect types to the input node, and may perform machine learning for predicting the defect type. The period for the defect type predicting module 30 to perform machine learning may be determined according to an amount of the learning data updated into the database 40. For example, each time a meaningful number of learning data are updated to the database 40, the defect type predicting module 30 may include the updated learning data and may perform machine learning.

The defect type predicting module 30 may be realized as a processor for performing a program having realized one of a supervised machine learning algorithm, an unsupervised machine learning algorithm, a semi-supervised machine learning algorithm, and a reinforced machine learning algorithm. When the defect type predicting module 30 is a processor for performing a program having realized a neural network algorithm, the defect type predicting module 30 may perform neural network learning to classify the defect type with label-assigned learning data. The defect type predicting module 30 may repeatedly perform neural network learning for predicting the defect type with the greatest probability from among a plurality of defect types that may be generated to the classify target based on the learning data. The defect type predicting module 30 may adjust weight values between activation functions of respective nodes of the neural network and the nodes so that the defect type predicted through the repeated neural network learning may approach the actual defect type.

The defect type predicting module 30 built through the above-noted machine learning may determine the defect type based on the input data. For example, when the input data are at least one of the maximum value, the minimum value, the center value, and the mean value of the battery voltage, and the number of peaks of the battery voltage, the defect type predicting module 30 may apply the respective elements configuring the input data to the corresponding input node and may determine one of a plurality of defect types. The number of the input nodes may be determined according to the number of the elements configuring the input data. The defect types may be classified according to causes of the short-circuit defect of the battery, and for example, it may include tab folded, broken, stabbed, and wrinkling of a separation film. The broken and the stabbed may respectively signify that parts of elements of the battery cell are broken or stabbed.

FIG. 3 shows an operation of a defect type predicting module according to an embodiment.

The defect type predicting module may be realized with a KNN classified model (K-Nearest-Neighbor classification) from among the machine learning models. In addition, regarding the classifying method described with reference to FIG. 3, the input data include the maximum value of the battery voltage and the number of the peaks of the battery voltage.

In the machine learning stage, the defect type predicting module 30 receives the maximum value of the battery voltage that is a value of the X-axis and the number of the peaks that is the number of the peaks of the battery voltage that is a value of the Y-axis, and is learned to output one of 'stabbed' and 'broken' as the defect cause. As shown in FIG. 3, the defect type predicting module 30 may perform learning on the batteries (class A) in which the cause of defect marked with stars is 'stabbed' and the batteries (class B) in which the cause of defect marked with triangles is 'broken'.

When finishing the machine learning, the defect type predicting module 30 may receive the maximum value Xi of the battery voltage corresponding to the position marked with quadrangles and the number Yi of the peaks of the battery voltage in FIG. 3, and may predict the cause of a defect of the battery according to the corresponding received value and the number.

In detail, the defect type predicting module 30 may receive the maximum value Xi of the battery voltage measured from the battery (hereinafter, target battery) for classifying the defect type and the number Yi of the peaks of the battery voltage.

As shown in FIG. 3 (*b*), the defect type predicting module 30 may calculate distance differences (hereinafter, deviations) between a position (hereinafter, target position) defined by the maximum value Xi of the battery voltage and the number Yi of the peaks of the battery voltage and all the positions (hereinafter, compared positions) corresponding to the learned data. The defect type predicting module 30 may deduce a predetermined number of reference data in least an order from among a plurality of deviations between the target position and the compared positions. For example, the defect type predicting module 30 may calculate first and second distance differences in the X-axis and the Y-axis between the target position and one of the compared positions, may perform a square root process on a value generated by squaring the calculated first and second distance differences and adding the same, and may then calculate deviations. The defect type predicting module 30 calculate a plurality of deviations between the target position and the compared positions according to the above-described method. The defect type predicting module 30 may arrange the calculated deviations in ascending order, may deduce a predetermined number of deviations in a least order, and may determine data of the compared positions corresponding to the deduced deviations to be reference data. However, the method for calculating deviations is not limited to the above-described method in the present disclosure.

As shown in FIG. 3 (*c*), the defect type predicting module 30 may position the reference data deduced from among the class A and the class B in a dotted circle. The defect type predicting module 30 may count the classes to which the respective reference data belong, and may classify the defect type of the target battery with the class that has a greater counting result. Referring to FIG. 3 (*c*), as the counting result of the class A is 1 and the counting result of the class B is 2, the defect type of the target battery may be predicted to be the class B (broken).

Regarding the example described with reference to FIG. 3, a dimension on the defect type is determined with the X-axis and the Y-axis, and types of the axis may increase such as the X-axis, the Y-axis, the Z-axis, . . . according to the number of the input data, so the number of the dimensions on the defect types may increase.

According to the above-described method, when the maximum value of the battery voltage of the target battery is 37V and the number of the peaks of the battery voltage is 3, the defect type predicting module 30 may classify the target battery into the class B (cause of defect: broken). In another way, when the maximum value of the battery voltage of the target battery is 47 V and the number of the peaks of the battery voltage is 5, the defect type predicting module 30 may classify the target battery into the class A (cause of defect: stabbed).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A defect type classifying system for a battery comprising:

a measurer connected to the battery, the measurer configured to detect a defect type, the measurer configured to measure at least one of electrical characteristics of the battery for a predetermined test period, the measurer configured to generate measured data, the measurer having a memory for storing the measured data, the measured data being based on a result obtained by measuring a battery voltage that is a voltage at respective ends of the battery for the predetermined test period;

a converter configured to generate input data by converting the measured data; and a defect type predicting module configured to use machine-learning learning data, the defect type predicting module configured to determine a defect type of the battery based on the input data, the defect type predicting module being realized as a processor, the defect type being classified according to causes of a short-circuit defect of the battery, including tab folded, broken, stabbed, and wrinkling of a separation film;

wherein the input data are appropriate for an input node of the defect type predicting module, and the defect type is classified according to a cause of a short-circuit defect of the battery, wherein the input data include a number of peaks of the battery voltage and at least one of a maximum value, a minimum value, a mean value, or a center value of the battery voltage, wherein the defect type predicting module is configured to machine-learn learning data stored in a database, the database classifies the input data for respective defect types and stores the same, and the corresponding input data and the defect type is updated in the database each time the defect is generated in the battery, and wherein the defect type predicting module is configured to calculate deviations that are distances of differences between at least one of electrical characteristics measured for a target battery of which a defect type is classified and respective values of the learning data, the defect type predicting module is configured to deduce a predetermined number of reference data in least order of the calculated deviations, and the defect type predicting module is configured to classify the defect type of the target battery with the class that has the greatest result of counting the classes to which the deduced reference data respectively belong.

2. The defect type classifying system of claim 1, wherein the converter is configured to analyze the measured data and is configured to extract the number of peaks of the battery voltage and the at least one of the maximum value, the minimum value, the mean value, or the center value of the battery voltage to generate the input data.

3. The defect type classifying system of claim 1, further comprising a database configured to store the learning data, wherein the database is configured to store the input data based on a voltage at respective ends of the battery and a defect type when a short-circuit defect of the battery is determined.

4. The defect type classifying system of claim 1, wherein the defect type predicting module is configured to receive at least one of electrical characteristics from the learning data, and the defect type predicting module is configured to learn to predict a defect type to be one of a plurality of classes that corresponds to the received one of the electrical characteristics.

5. A defect type classifying method comprising:

learning, by a defect type predicting module that is realized as a processor, to classify a defect type according to a cause of a short-circuit defect of a battery based on learning data;

measuring, by a measurer, at least one of electrical characteristics of the battery for a test period and generating measured data, the measurer having a memory that stores the measured data, the measured data being based on a result obtained by measuring a battery voltage that is a voltage at respective ends of the battery for the test period;

converting, by a converter, the measured data and generating input data;

determining, by the defect type predicting module, a defect type of the battery based on the input data, the defect type being classified according to causes of a short-circuit defect of the battery, including tab folded, broken, stabbed, and wrinkling of a separation film, the determining of a defect type including calculating deviations that are distance differences between at least one of electrical characteristics measured for the target battery from which the defect type is classified and respective values belonging to the learning data; and deducing a number of reference data in least order from among the calculated deviations, and classifying the defect type of the target battery with the class that has a greatest result of counting classes to which the deduced reference data respectively belong, wherein the input data are appropriate for an input node of the defect type predicting module, wherein the input data include a number of peaks of the battery voltage and at least one of a maximum value, a minimum value, a mean value, or a center value of the battery voltage, and wherein the defect type predicting module machine-learns learning data stored in a database, the database classifies the input data for respective defect types and stores the same, and the corresponding input data and the defect type is updated in the database each time the defect is generated in the battery.

6. The defect type classifying method of claim 5, wherein the generating of the input data includes analyzing the measured data, extracting the number of peaks of the battery voltage and the at least one of the maximum value, the minimum value, the mean value, or the center value of the battery voltage, and generating the input data.

7. The defect type classifying method of claim 5, further comprising:

storing, by a database, the input data based on a voltage at respective ends of the battery and the defect type when a short-circuit defect of the battery is generated as the learning data.

8. The defect type classifying method of claim 5, wherein the learning to classify the defect type includes:

receiving at least one of electrical characteristics from the learning data; and learning to predict the defect type that corresponds to one of the received electrical characteristics to be one of a plurality of classes.

* * * * *